United States Patent
Huang et al.

(10) Patent No.: US 12,453,139 B2
(45) Date of Patent: Oct. 21, 2025

(54) TRANSISTOR DEVICE AND METHOD FOR PRODUCING A TRANSISTOR DEVICE

(71) Applicant: Infineon Technologies Austria AG, Villach (AT)

(72) Inventors: Weichun Huang, Torrance, CA (US); Timothy Henson, Mount Shasta, CA (US); Ling Ma, Redondo Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 498 days.

(21) Appl. No.: 17/947,494

(22) Filed: Sep. 19, 2022

(65) Prior Publication Data
US 2023/0101553 A1 Mar. 30, 2023

(30) Foreign Application Priority Data

Sep. 29, 2021 (EP) .................................... 21200016

(51) Int. Cl.
*H10D 62/00* (2025.01)
*H10D 30/66* (2025.01)
*H10D 62/10* (2025.01)

(52) U.S. Cl.
CPC ......... *H10D 62/111* (2025.01); *H10D 30/668* (2025.01); *H10D 62/127* (2025.01)

(58) Field of Classification Search
CPC .. H10D 62/111; H10D 30/668; H10D 62/127; H10D 30/665; H10D 64/112; H10D 64/256; H10D 62/393; H10D 64/117; H10D 30/0297

USPC ......................................................... 257/330
See application file for complete search history.

(56) References Cited

U.S. PATENT DOCUMENTS

| | | | |
|---|---|---|---|
| 2004/0119076 A1* | 6/2004 | Ryu ...................... | H10D 62/157 257/77 |
| 2007/0001263 A1* | 1/2007 | Nakagawa ........... | H10D 62/127 257/E21.384 |
| 2008/0135929 A1 | 6/2008 | Saito et al. | |
| 2011/0006364 A1 | 1/2011 | Ono et al. | |

(Continued)

FOREIGN PATENT DOCUMENTS

EP          3514834 A1     7/2019

*Primary Examiner* — Sheikh Maruf
(74) *Attorney, Agent, or Firm* — Murphy, Bilak & Homiller, PLLC

(57) ABSTRACT

A transistor device includes: a semiconductor body having opposing first and second surfaces; an edge termination region laterally surrounding an active area; a drain region of a first conductivity type at the second surface; and a drift region of the first conductivity type on the drain region. In the active area, a body region of a second conductivity type is on the drift region, a source region of the first conductivity type is on the body region, and at least one gate electrode is positioned in a gate trench that extends into the semiconductor body from the first surface. A superjunction structure includes columns of the second conductivity type extending into the semiconductor body substantially perpendicular to the first surface in the active area and edge termination region. A first contact extends through the body region for each second conductivity type column in the active region and is electrically conductive.

17 Claims, 11 Drawing Sheets

(56) References Cited

U.S. PATENT DOCUMENTS

| | | | | |
|---|---|---|---|---|
| 2012/0306464 | A1* | 12/2012 | Hirler | H03K 17/04123 |
| | | | | 327/434 |
| 2015/0015309 | A1* | 1/2015 | Werber | H03K 17/567 |
| | | | | 327/434 |
| 2015/0137223 | A1* | 5/2015 | Siemieniec | H10D 64/256 |
| | | | | 257/331 |
| 2015/0179637 | A1* | 6/2015 | Pfirsch | H10D 84/403 |
| | | | | 257/334 |
| 2015/0380533 | A1* | 12/2015 | Sandow | H10D 12/461 |
| | | | | 257/139 |
| 2016/0093690 | A1* | 3/2016 | Falck | H10D 62/142 |
| | | | | 257/493 |
| 2016/0359026 | A1* | 12/2016 | Matsuura | H10D 64/518 |
| 2017/0018637 | A1* | 1/2017 | Kitamura | H10D 12/038 |
| 2018/0006109 | A1* | 1/2018 | Mauder | H10D 64/117 |
| 2018/0006110 | A1* | 1/2018 | Mauder | H10D 84/141 |
| 2018/0019310 | A1* | 1/2018 | Hirler | H10D 64/117 |
| 2018/0358433 | A1 | 12/2018 | Su et al. | |

\* cited by examiner

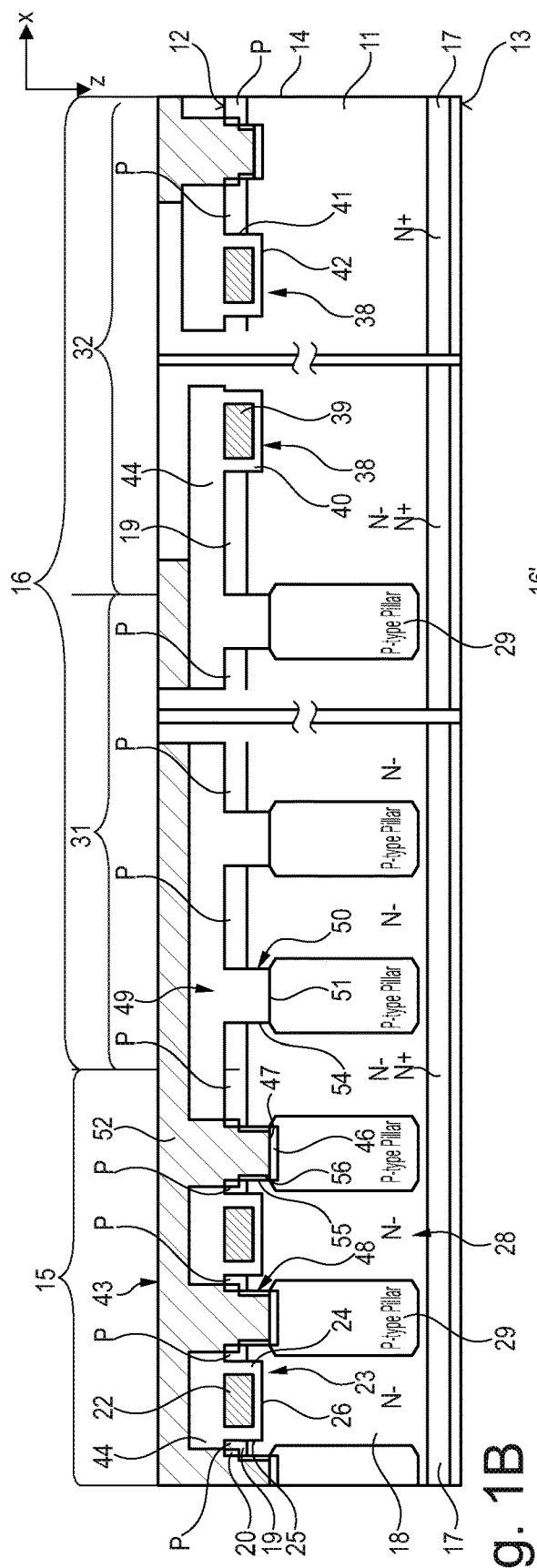
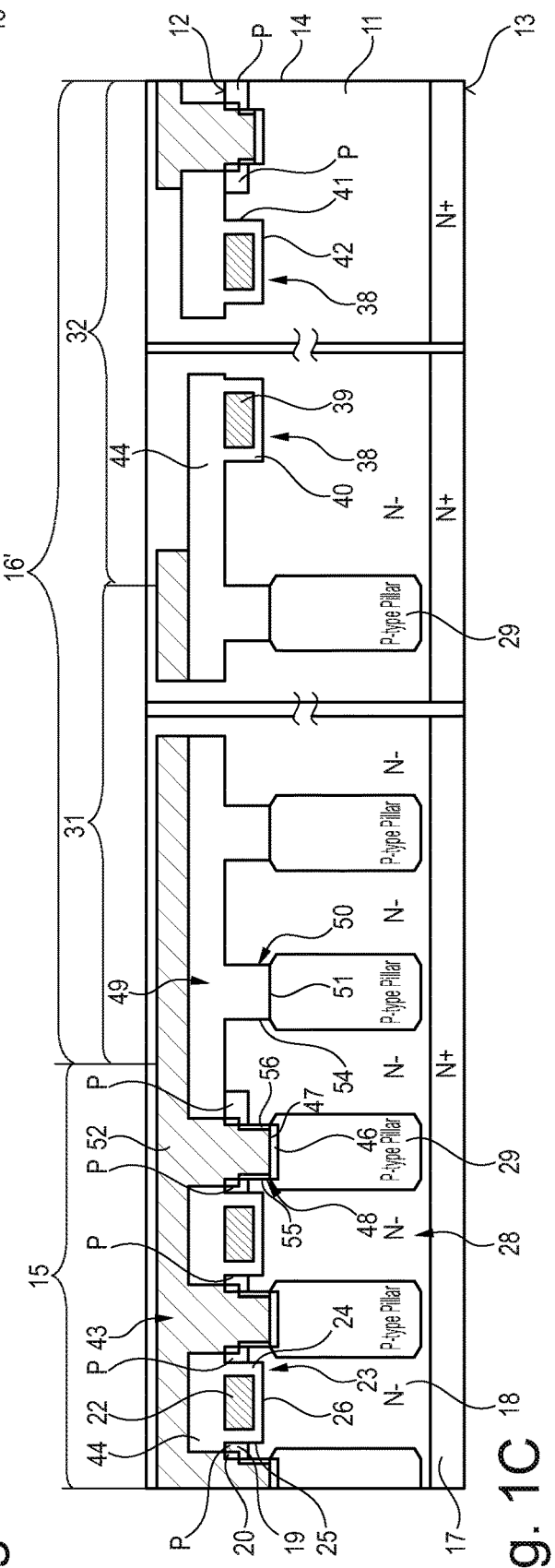
Fig. 1B
Fig. 1C

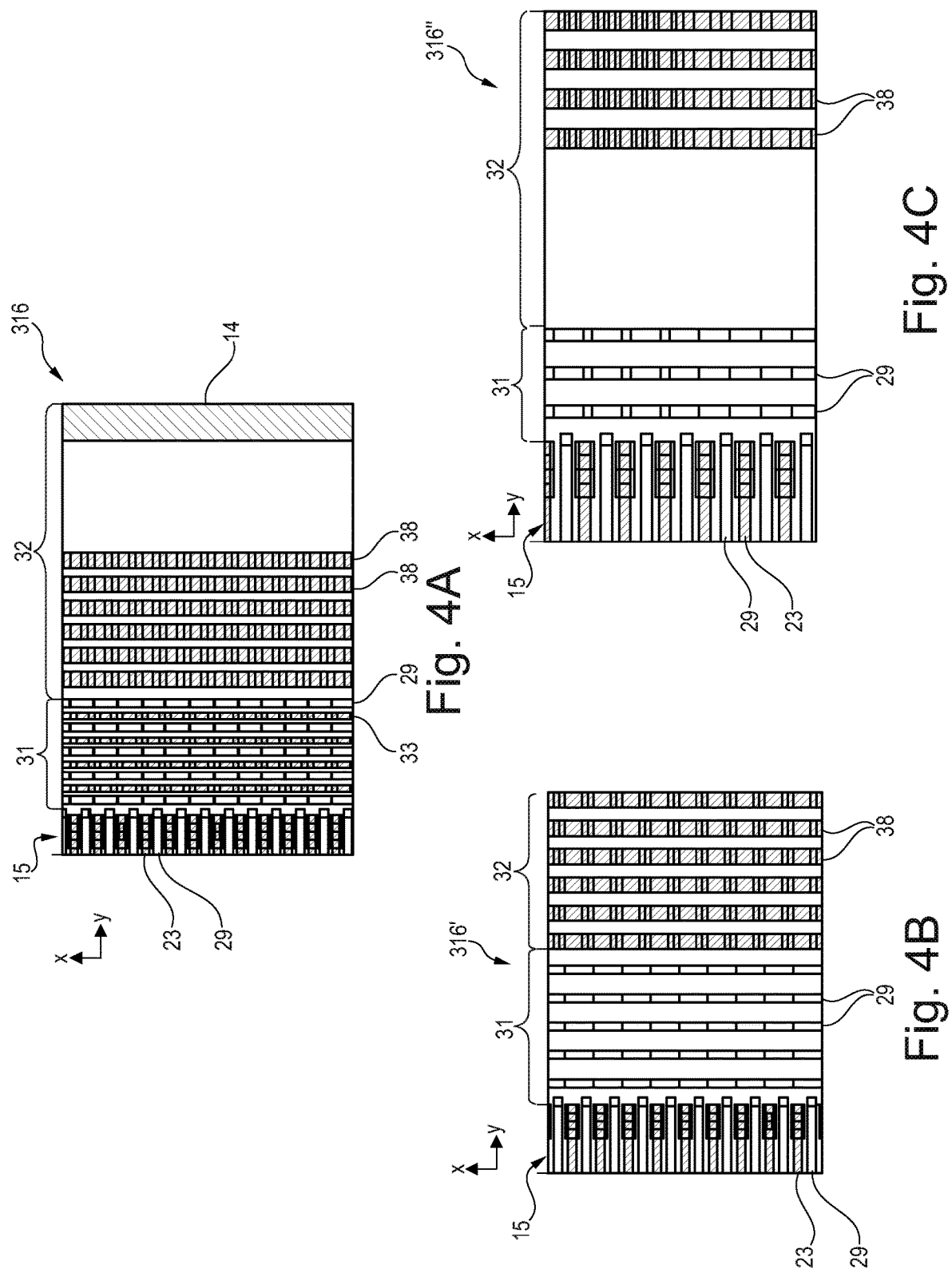

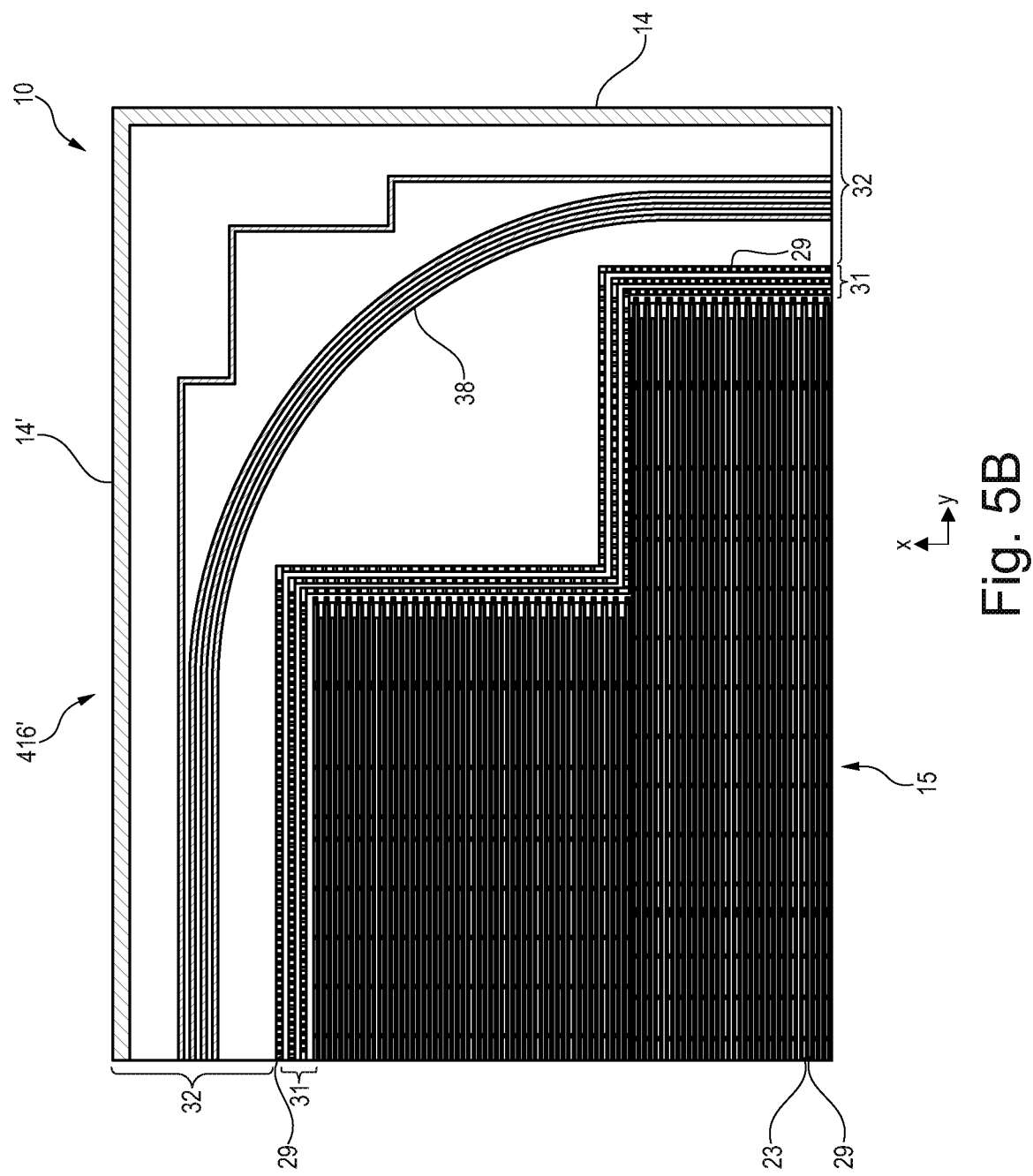

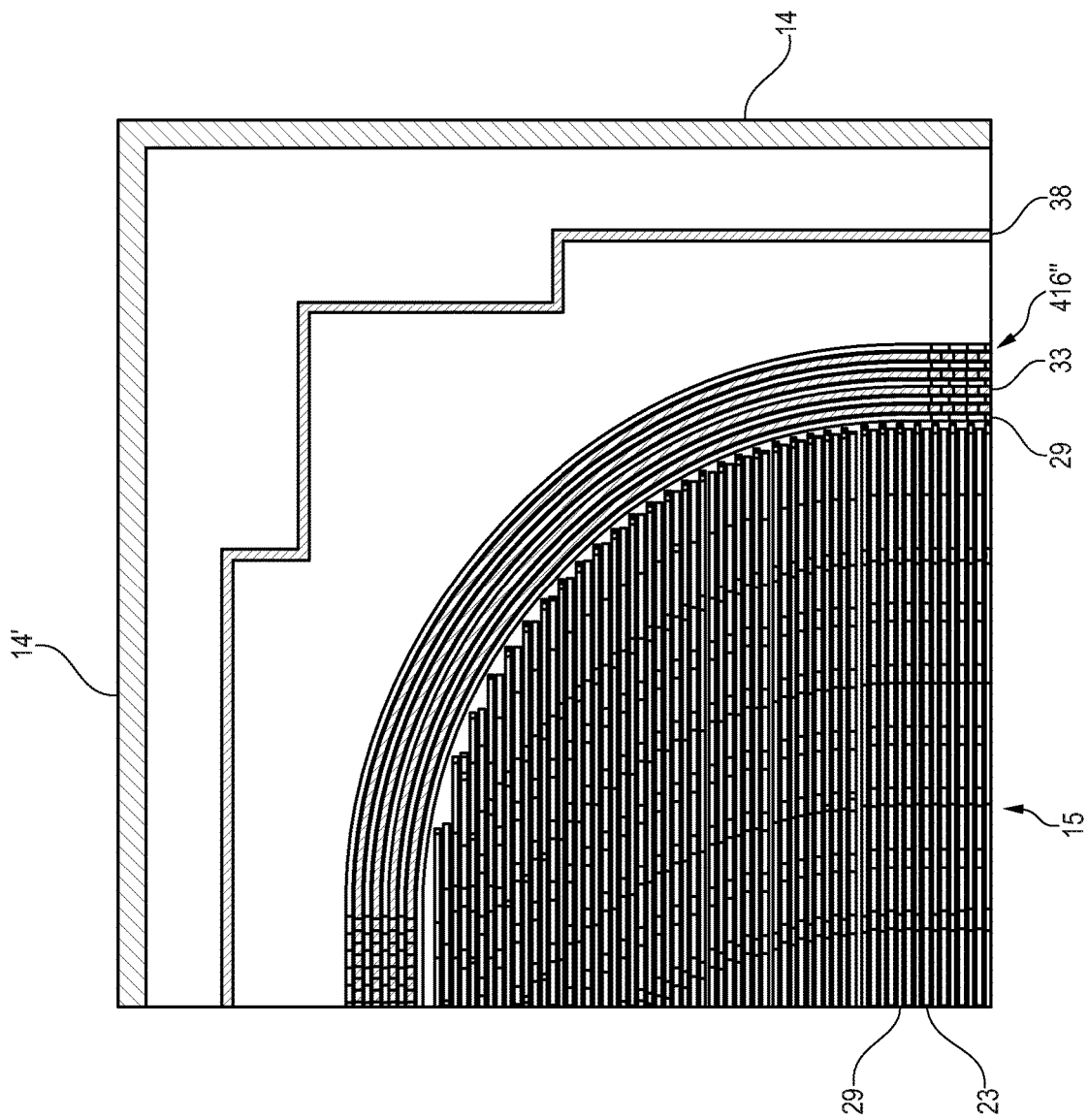

TRANSISTOR DEVICE AND METHOD FOR PRODUCING A TRANSISTOR DEVICE

BACKGROUND

Transistor devices used in power electronic applications are often fabricated with silicon (Si) semiconductor materials. Common transistor devices for power applications include Si CoolMOS®, Si Power MOSFETs and Si Insulated Gate Bipolar Transistors (IGBTs). A transistor device typically includes an active cell field including a plurality of transistor cells, each having a transistor structure. Typically, the active cell field of the transistor device is laterally surrounded by an edge termination structure which serves to avoid breakdown of the semiconductor device due to edge effects and to improve the performance of the device.

A transistor device for power applications may be based on the charge compensation principle, in particular have a superjunction structure for charge compensation. A superjunction device, which is often also referred to as a compensation device, includes a drift region with a plurality of regions of a first doping type (conductivity type) and a plurality of regions of a second doping type (conductivity type) complementary or opposite to the first doping type. Typically, the oppositely doped first and second regions each have the form of a vertical column which extends perpendicularly to the major surfaces of the device. When a blocking voltage is applied to the superjunction device, a lateral electric field rises and clears out the mobile charge carriers along the vertical pn junctions between the first and second regions. A space charge zones begins to expand perpendicularly to the direction of a load current flow in the on-state. The mobile charge carriers are completely forced out of the superjunction structure at a comparatively low blocking voltage. When the blocking voltage is further increased, the depleted superjunction structure acts as a quasi-intrinsic layer and the vertical electric field rises. In the superjunction structure, the breakdown voltage is decoupled from the dopant concentrations such that the dopant concentration in the superjunction structure can be comparatively high. Therefore, superjunction devices typically combine very low on-state resistance with high blocking capability.

US 2020/0365719 A1 discloses an example of a superjunction transistor device with an active region and an edge termination structure region which has a voltage withstanding structure that surrounds a periphery of the active region.

Further improvements to the edge termination structure are desirable to improve the performance of superjunction transistor devices.

SUMMARY

According to an embodiment, a transistor device comprises a semiconductor body comprising a first surface, a second surface opposing the first surface and side faces. The transistor device comprises an active area and an edge termination region laterally surrounding the active area, a drain region of a first conductivity type at the second surface of the semiconductor body and a drift region of the first conductivity type on the drain region. In the active area, a body region of a second conductivity type that opposes the first conductivity type is arranged on the drift region and a source region of the first conductivity type is arranged on the body region. In the active area, at least one gate electrode is positioned in a gate trench that extends into the semiconductor body from the first surface. The gate electrode is electrically insulated from the semiconductor body by a gate dielectric. The transistor device further comprises a superjunction structure comprising a plurality of columns of the second conductivity type extending into the semiconductor body substantially perpendicularly to the first surface. The superjunction structure is positioned in the active area and in the edge termination region. The transistor device further comprises a plurality of first contacts. A first contact extends through the body region for each of the columns of the second conductivity type in the active region. The first contact comprises electrically conductive material.

The first conductivity type may be n-type and the second conductivity type may be p-type. Alternatively, the second conductivity type is n-type and the first conductivity type is p-type. Since the superjunction structure comprises columns of a second conductivity type in the drift region of the first conductivity type, a plurality of pn junctions is formed which extend perpendicularly to the first surface.

The active area is distinguishable from the edge termination region in that the edge termination region is free of the source region, i.e. the source region is located exclusively in the active area. In some embodiments, in the active area, the source region is arranged on the body region and extends to the first surface of the semiconductor body.

The gate trench extends into the semiconductor body from the first surface. The electrically conductive gate electrode in the gate trench may be electrically insulated from the semiconductor body by a gate dielectric that is positioned on and lines side walls and a base of the gate trench. In the active area, one gate electrode is arranged between and spaced apart from neighbouring ones of the columns of the second conductivity type.

In the active area, the top of the columns of the second conductivity type is spaced apart from the body region in the active area by a portion of the drift region. The base of the first contact is in electrical contact with and is positioned in the column of the second conductivity type. In the active area, each column of the second conductivity type is electrically connected to the body region and to the source region by one of the first contacts which extends from the column of the second conductivity type through the intervening portion of the drift region, through the body region and source region to the first surface.

In some embodiments, each first contact is provided by a trench in the semiconductor body that comprises an electrically conductive material. The first contacts for each column of the second conductivity type are laterally spaced part from one another. The first contacts may be electrically connected together by an electrically conductive layer arranged on the first surface of the semiconductor body.

In some embodiments, the columns of the second conductivity type have the same pitch and the same depth in the active area and in the edge termination region.

In some embodiments, the body region is positioned exclusively in the active area so that in the edge termination region the drift region extends to the first surface.

In some embodiments, the body region further extends into the edge termination region and in some embodiments, extends to the side faces of the semiconductor body. In these embodiments, the body region extends from one side face to the opposing side face.

If the body region is provided in the edge termination region, the tops of one or more of the columns of the second conductivity type in the inner termination region is spaced apart from the body region by a portion of the semiconductor body having the first conductivity type.

A pn junction is formed between the body region and the drift region since they comprise opposing conductivity types. In some embodiments, the depth of pn junction formed between the drift region and the body region in the edge termination region is substantially uniform in a lateral direction from the active area to the side face of the semiconductor body.

In some embodiments, the depth of pn junction formed between the drift region and the body region in the edge termination region is substantially uniform throughout the edge termination region.

In some embodiments, the depth of pn junction formed between the drift region and the body region in the edge termination region is substantially uniform throughout the active area and the edge termination region.

In some embodiments, the transistor device further comprises a contact well arranged at a base of each of the first contacts in the active area. The contact well is of the second conductivity type and is in contact with the column of the second conductivity type and spaced apart from the body region. The contact well and the column of the second conductivity type are vertically spaced apart from the body region by a portion of the drift region and electrically connected to the body region and source region by way of the first contact.

In some embodiments, the edge termination region comprises an inner edge termination region and an outer edge termination region. The inner edge termination region may laterally and continuously surround the active area and the outer edge termination region may laterally and continuously surround the inner edge termination region. One or more columns of the second conductivity type are arranged in the inner edge termination region and the outer edge termination region is free of columns of the second conductivity type.

In some embodiments, in the active region the columns of the second conductivity type are electrically connected to source potential, and in the inner termination region, the one or more of the columns of the second conductivity type are electrically floating.

In some embodiments, the transistor device further comprises a second contact that extends to each column of the second conductivity type in the inner termination region. The second contact comprises an insulating material.

In some embodiments, each second contact is formed by a trench formed in the first surface and extending into the semiconductor body to an individual one of the columns of the second conductivity type. If a body region is present in the inner termination region, the tops of the columns of the second conductivity type are vertically spaced apart from the body region by a portion of the semiconductor body. The second contact and trench comprising insulating material extends through the body region and intervening portion of the semiconductor body to each of the columns of the second conductivity type.

In some embodiments, the second contact to the one or more of the individual ones of the columns of the second conductivity type positioned in the inner edge termination region is electrically insulating. If two or more electrically insulating contacts for the columns of the second conductivity type in the inner edge termination region are provided, these electrically insulating contacts are laterally spaced part from one another. These electrically insulating contacts in the inner edge termination region may each be provided by a trench in the semiconductor body that comprises a dielectric material.

In some embodiments, the second contact further comprises conductive material that is electrically insulated from the semiconductor body by the insulating or dielectric material that lines the trench.

In some embodiments, the transistor device further comprises a transition region that is arranged laterally between the active area and the inner edge termination region. One or more columns of the second conductivity type are arranged in the transition region and are electrically connected to source potential. One of more columns of the second conductivity type are arranged in the transition region and in the inner edge termination region.

In some embodiments, one of the plurality of first contacts extends from the first surface to each of the columns of the second conductivity type in the transition region. The first contacts are electrically conductive. The transition region is distinguished from the active region in that the transition region is free of the source region.

The transition region is distinguished from the inner edge termination region in that in the transition region the column (s) of the second conductivity type are electrically connected to source potential by an electrically conductive first contact and in the inner edge termination region the column(s) of the second conductivity type are electrically floating as the second contacts are electrically insulating.

In some embodiments, in the active region the columns of the second conductivity type are electrically connected to source potential, in the transition region one or more of the columns of the second conductivity type are electrically connected to source potential and in the inner termination region, one or more of the columns of the second conductivity type are electrically floating.

In some embodiments, the body region Is further positioned in the transition region in addition to the inner and outer edge termination region. In the transition region, the tops of the columns of the second conductivity type are spaced apart from the body region by a portion of the semiconductor body that has the first conductivity type. The individual ones of the first contacts extends through the body region and intervening portion of the semiconductor body to its respective one of the columns of the second conductivity type in the transition region.

In some embodiments, the first contact to one or more of the individual ones of the columns of the second conductivity type positioned in the transition region of the edge termination region is electrically conductive. If two or more electrically conductive contacts for the columns of the second conductivity type in the edge termination region are present, these electrically conductive contacts are laterally spaced part from one another. Each contact may be provided by a trench in the semiconductor body that comprises an electrically conductive material. These contacts in the transition region of the edge termination region may be electrically connected together by an electrically conductive layer arranged on the first surface. These contacts in the edge termination region may also be electrically connected to the contacts to the columns of the second conductivity type arranged in the active area by a common electrically conductive layer arranged on the first surface.

In some embodiments, a combination of electrically conductive and electrically insulating contacts is provided in the edge termination region. In some embodiments, the contact to one or more of the individual ones of the columns of the second conductivity type positioned in the transition region is electrically conductive and the contact to a further one or more of the individual ones of the columns of the second conductivity type positioned in the inner edge termination region is electrically insulating, wherein the electrically insulating contact is positioned outboard, i.e. peripheral to, the electrically conductive contact.

In some embodiments, the transistor device further comprises one or more trenches in the transition region, wherein one trench of the plurality of trenches is arranged laterally between individual ones of the columns of the second conductivity type. The individual trenches are spaced apart from the columns of the second conductivity type positioned on the two opposing sides by a portion of the semiconductor body having the first conductivity type.

In some embodiments, the transistor device further comprises one or more trenches in the inner edge termination region, wherein one trench of the plurality of trenches is arranged laterally between individual ones of the columns of the second conductivity type. The individual trenches are spaced apart from the columns of the second conductivity type positioned on the two opposing sides by a portion of the semiconductor body having the first conductivity type.

In some embodiments, one or more of the plurality of trenches laterally surrounds the active area.

In some embodiments, the trenches each comprise conductive material that is electrically insulated from the semiconductor body by insulating material that lines the trench. In some embodiments, the trenches have substantially the same structure as the gate trenches but are not electrically connected to the gate trenches or to one another.

In some embodiments, the transistor device further comprises at least one edge trench arranged in the outer edge termination. The at least one edge trench laterally and continuously surrounds the active area. The at least one edge trench is positioned laterally outside of the columns of the second conductivity type. The edge trench may be filled with insulating material or may comprise conductive material that is electrically insulated from the semiconductor body by an insulation material that lines the edge trench.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 1B illustrates a cross-sectional view of the edge termination region according to an embodiment.

FIG. 1C illustrates a cross-sectional view of the edge termination region according to an embodiment.

FIG. 4A illustrates a plan view of a portion of an edge termination region of a transistor device according to an embodiment.

FIG. 4B illustrates a plan view of a portion of an edge termination region of a transistor device according to an embodiment.

FIG. 4C illustrates a plan view of a portion of an edge termination region of a transistor device according to an embodiment.

FIG. 5B illustrates a plan view of a corner portion of an edge termination region of a transistor device according to an embodiment.

FIG. 5C illustrates a plan view of a corner portion of an edge termination region of a transistor device according to an embodiment.

DETAILED DESCRIPTION

Figure 1A:
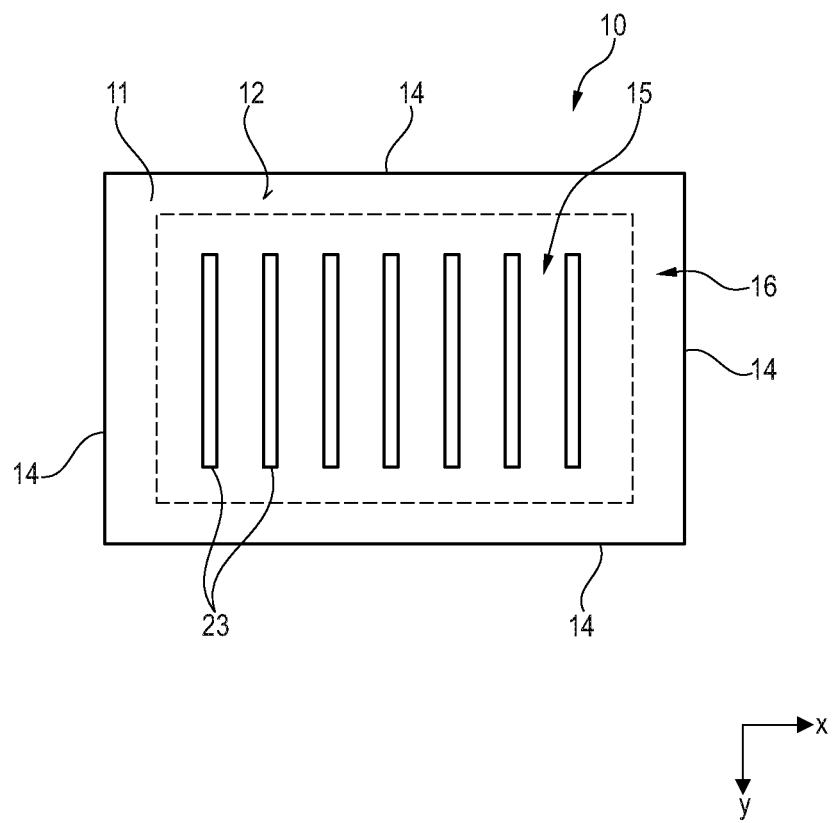
FIG. 1A illustrates a plan view of a transistor device according to an embodiment comprises an active area and an edge termination region.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

A transistor device is optimized for switching applications and typically has a voltage rating indicating the voltage at which the transistor device may be safely operated. When the transistor device is off, it is capable of blocking a certain voltage, such as 100V, 120V or 150V, known as the blocking voltage or BVDSS for a particular drain source current ($I_{DS}$). When the transistor device is on, it has a sufficiently low on-resistance (RON) for the application in which it is used, i.e. it experiences sufficiently low conduction loss when a substantial current passes through the device.

Some types of transistor device, including superjunction transistor devices, include a cell field comprising a plurality of substantially identical transistor cells, each having a transistor structure. The cells are electrically connected to form a single transistor device for switching. The cell field provides the active area of the transistor device within the semiconductor die in which the transistor device is formed. The transistor device includes an edge termination region that laterally surrounds the cell field and that has an edge termination structure that serves to reduce the peak lateral electric field between the cell field and the side faces of the transistor device, i.e. the side faces of the semiconductor die, to avoid breakdown of the semiconductor device due to edge effects and to improve the performance of the device.

The disclosure provides edge termination structures that are suitable for a superjunction or charge balance transistor device having implanted columns of the opposing conductivity type to the conductivity type of the drift region. These implanted columns of the opposing conductivity type are also positioned in the edge termination region and may have the same pitch as those in the active region. In some embodiments, the columns of the opposing conductivity type positioned in the edge termination region extend parallel to and laterally adjacent to those in the active area and in some embodiments, the columns of the opposing conductivity type positioned in the active area extend into the edge termination region.

In some embodiments, a plurality of trenches is formed in the semiconductor substrate and dopants implanted into the base of the trenches to form the columns of a conductivity type that opposes the conductivity type of the semiconductor substrate, for example p-type columns in a n-type semiconductor substrate. Utilizing multiple trenches to implement the superjunction structure can assist in effectively reducing the total area taken by termination and thus further shrink total die size area. The device has not only a low on-resistance, but also high ruggedness. An improvement in AC performance can also be achieved.

FIGS. 1A to 1E illustrate a transistor device 10 according to an embodiment, whereby FIG. 1A illustrates a top view of the transistor device 10 and FIGS. 1B to 1E illustrate a cross-sectional view of a portion of the transistor device 10 according to various embodiments.

The transistor device 10 comprises a semiconductor substrate or semiconductor body 11 that has a first surface 12, a second surface 13 that opposes the first surface 12 and side faces 14. The side faces 14 extend between the first surface 12 and the second surface 13. The semiconductor body typically has a cuboid shape in which the first and second surfaces 12, 13 are each substantially planar and extend substantially parallel to one another and four side faces 14 extend substantially perpendicularly to the first surface 12 and second surface 13. The first surface 12 can be referred to as the top surface and the second surface 13 as the rear surface. Using the Cartesian coordinate system, the first surface 12 may lie in the x-y plane and the side faces 14 extend in the z direction.

The semiconductor body 11 may comprise silicon and may include a monocrystalline silicon epitaxial layer deposited on a substrate such as a single crystal silicon substrate. The transistor device 10 may be a Field Effect Transistor device, such as a MOSFET device having a superjunction compensation structure.

The transistor device comprises an active area 15 and an edge termination region 16 that laterally surrounds the active area 15. The active area 15 includes a plurality of transistor cells, each transistor cell having a transistor structure. The edge termination region 16 is positioned at the periphery of the semiconductor body 11 and encircles the active area 15 on all sides. The active area 15 is used for switching and the edge termination region 16 comprises an edge termination structure for avoiding breakdown of the transistor device 10 at or near the first surface 12 and for increasing the breakdown voltage of the transistor device 10. The edge termination structure may, for example, lower the field intensity junction by spreading the electric field lines across the edge termination region 16.

As can be seen in the cross-sectional views of FIGS. 1B to 1E, the semiconductor body 11 comprises a drain region 17 of a first conductivity type at the second surface 13, a drift region 18 of the first conductivity type arranged on the drain region 17 and a body region 19 of a second conductivity type arranged on the drift region 18. The second conductivity type opposes the first conductivity type. For example, the first conductivity type may be n-type and the second conductivity type may be p type. Alternatively, the first conductivity type may be p type in which case the second conductivity type is n type. The drain region 17 and the drift region 18 extend over the entire area of the semiconductor body 11. The drain region 17 is typically more highly doped than the drift region 18.

In the active area 15 of the semiconductor body 11, a source region 20 of the first conductivity type is arranged on the body region 19. The source region 20 is typically more highly doped than the drift region 18. The edge termination region 16 does not, however, include a source region 20. The source region 20 is positioned exclusively in the active area 15.

The active area 15 further comprises a plurality of gate electrodes 22, whereby each gate electrode 22 is positioned in a gate trench 23. The gate trench 23 extends into the semiconductor body 11 from the first surface and has side walls 25 which are substantially perpendicular to the first surface 12 and a base 26. The gate trench 23 includes a gate electrode 22 which is electrically insulated from the semiconductor body 11 by a gate dielectric 24 which lines the side walls 25 and the base 26 of the gate trench 23. The gate trench 23 may have an elongate stripe-like form in plan view. Each transistor cell includes a gate trench 23 which extends through the source region 20 and body region 19. The base of 26 of the gate trench 23 is positioned at a greater depth from the first surface 12 than the depth of the pn junction 21 between the drift region 18 and the body region 19.

The transistor device 10 further comprises a superjunction structure 28 which comprises a plurality of columns 29 of the second conductivity type that extend substantially perpendicular to the first surface 12. The columns 29 are positioned in the drift region 18 and are located in both the active area 15 and in the edge termination region 16. The columns 29 of the second conductivity type do not extend as far as the drain region 17 and are vertically spaced apart from the drain region 17 by a portion of the drift region 18. In the active area 15, the upper end of the columns 29 is arranged below and vertically spaced apart from the body region 19. The columns 29 form pn junctions with the drift region 18 which extend substantially perpendicularly to the first surface 12. The columns 29 of the second conductivity type have a lateral pitch which may be the same in the active area 15 and in the edge termination region 16. In the active area 15, one of the gate trenches 23 is positioned between and laterally spaced apart from neighbouring ones of the columns 29 of the second conductivity type.

The edge termination region 16 according to a first embodiment will now be described with reference to FIG. 1B. The edge termination region 16 comprises two concentric subregions, namely an inner edge termination region 31 and an outer edge termination region 32. The inner edge termination region 31 laterally surrounds the active region 15 and the outer edge termination region 32 laterally surrounds the edge termination region 31 and extends to the side faces 14 semiconductor body. The edge termination region 16 has a different structure in each of these subregions. The inner edge termination region 31 comprises a superjunction structure 28 comprising at least one column 29 of the second conductivity type which extends substantially perpendicularly to the first surface 12 and which is positioned in the drift region 18. In the edge termination region 16, the drift region 18 may also be referred to as simply as the semiconductor body 11 since it does not contribute to the switching function of the transistor device 19.

In the embodiment of the edge termination region 16 illustrated in FIG. 1B, the body region 19 is positioned in both the active area 15 and in the edge termination region 16. In some embodiments, the body region 19 extends throughout both the active area 15 and the edge termination area region 16 and extends to all of the side faces 14 of the semiconductor body 11. The columns 29 of the second conductivity type positioned in the active area 15 and in the edge termination region are vertically spaced apart, that is spaced apart in the z direction, from the body region 19 by a portion of the drift region 18 and the semiconductor body 11, respectively. In this embodiment, the body region 19 extends throughout the inner and outer edge termination regions 31, 32 and has a depth from the first surface 12 that is substantially the same throughout the active area 15, inner edge termination region 31 and outer edge termination region 32. The pn junction formed between the body region 19 and the drift region 11 and semiconductor body 11 is positioned at substantially the same depth from the first surface 12 throughout the active area 15, the inner edge termination region 31 and outer edge termination region 32

The inner edge termination region 32 is distinguishable from the active area 15 in that it does not include a source region and also does not include gate trenches between the columns 29 of the second conductivity type. The outer edge termination region 32 is distinguishable from the inner edge termination region 31 in that it does not include a superjunction structure and therefore, is free of columns of the second conductivity type.

In some embodiments, the outer edge termination region 32 includes one or more edge trenches 38. The edge trenches 38 extend into the semiconductor body 11 from the first surface 12. In plan view, the one or more edge trenches 38 may laterally surround the active area 15 and also continuously and uninterruptedly encircle the active area 15. Since the outer edge termination region 32 is positioned laterally outside of the inner edge termination region 31, the edge trenches 38 also laterally surround and continuously and uninterruptedly encircle the inner edge termination region 31. The edge trenches 38 may comprise a conductive material 39 which is electrically insulated from the semiconductor body 11 by an insulating layer 40 which lines the sidewalls 41 and base of the trench 42. The edge trenches 38 may be fabricated at the same time as the gate trenches 23. In other embodiments, the edge trenches 38 may have a different structure from the gate trenches 23. In some embodiments, the edge trenches 38 may be entirely filled with an insulating material.

A first contact 43 is provided for each of the columns 29 of the second conductivity type which are positioned in the active area 15. The first contacts 43 are, therefore, positioned laterally between and spaced apart from the gate trenches 23 in the active area 15. Each first contact 43 is positioned in a trench 48 that is formed in the semiconductor body 11 and that extends into the semiconductor body 11 from the first surface 12. In the active area, the first contact 43 extends through the source region 29, the body region 19 and a portion of the drift region 18. The first contact 43 has a base which is positioned in the column 29 of the second conductivity type at a depth from the first surface 12 which is greater than the depth of the pn junction 21 between the body region 19 and drift region 18.

The first contacts 43 comprise an electrically conductive material and each first contact 43 provides an electrically conductive connection to the source region 20, body region 19 and to the column 29 of the second conductivity type. The lower portion of the side walls 55 of the trenches 48 include an insulating layer 56 which electrically insulates the electrically conductive material of the first contact 43 from the drift region 18. The insulating layer 56 may extend from the body region 19 to the top of the column 29 of the second conductivity type. The electrically conductive material of the first contact 43 is in direct contact with the source region 20, the body region 19 and the columns 29 of the second conductivity type or contact region 46 if present.

The first contacts 43 in the active area 15 are electrically connected to one another by an electrically conductive layer 52, typically a metallic layer, arranged on the first surface 12. The conductive layer 52 and the first contacts 43 are insulated from the gate electrodes 23 by a dielectric layer 44 arranged between the first surface 12, the gate electrodes 22 and the overlying conductive layer 52. The first contacts 43, therefore, also extend through the dielectric layer 44.

Figure 2A:
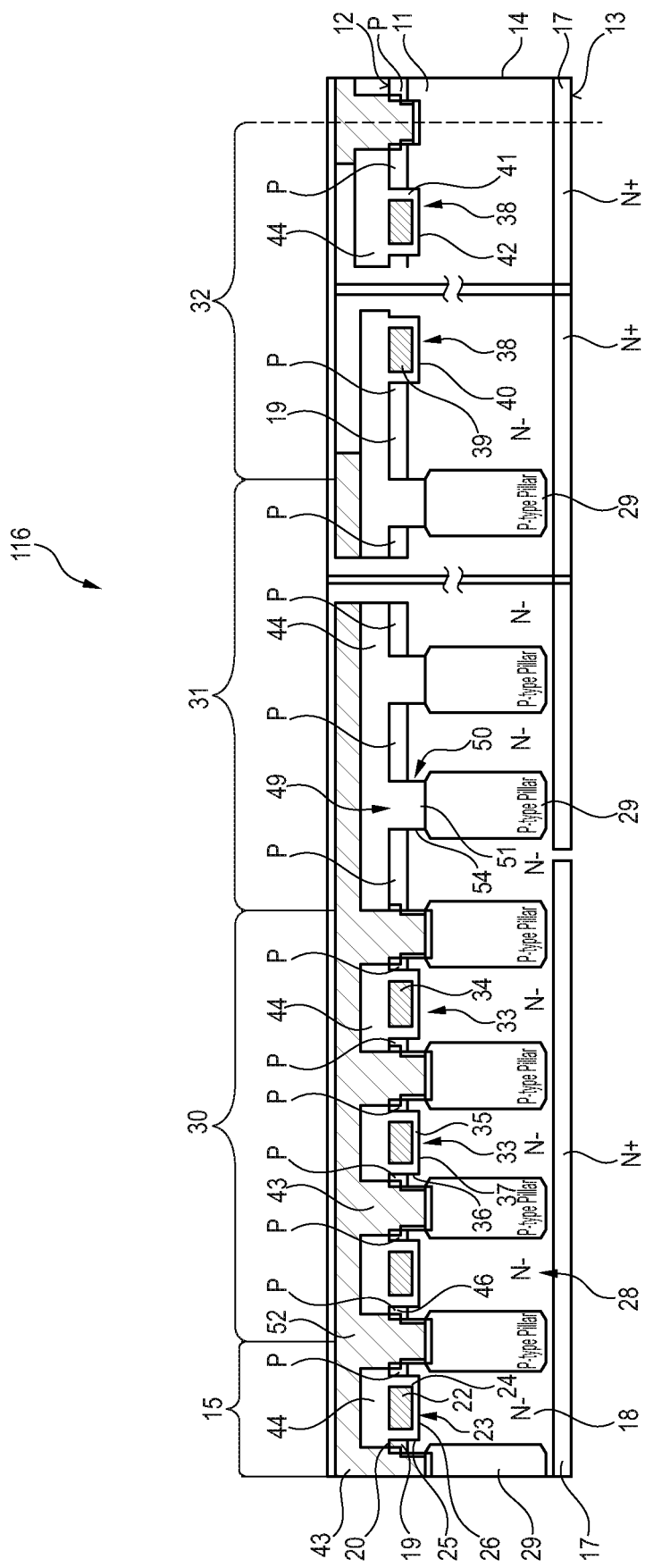
FIG. 2A illustrates a cross-sectional view of an edge termination region of a transistor device according to an embodiment.

In some embodiments, a doped contact region 46 is provided at the base 47 of the trench 48 for each first contact 43. The doped contact region or contact well 46 is positioned at the top of the column 29 of the second conductivity type and is spaced apart from the body region 19 by a portion of the drift region 18. The contact region 46 is more highly doped than the body region 19. A contact region 46 of the second conductivity type is also positioned at the top of the body region 19 and next to the source region 20, as is illustrated in FIG. 2A for example.

The inner edge termination region 31 also comprises at least one column 29 of the second conductivity type. The top of the columns 29 of the second conductivity type is vertically spaced part from the body region 19 by a portion of the drift region 18. A second contact 49 is provided in the inner edge termination region 31 for each of the columns 29 of the second conductivity type. The second contact 49 is formed in a trench 50 which extends from the first surface 12 through the body region 19 and the intervening portion of the semiconductor body 11 and has a base 51 which is positioned in the column 29 of the second conductivity type. The base 51 of the second contact 49 may have a depth from the first surface 12 which is the same or less than the depth of the base 47 of the openings 48 for the first contacts 43 in the active region 15 and in the transition region 30. The second contacts 49 are laterally spaced part from one another by the body region 19 and drift region 18.

In contrast to the first contact 43, the second contact 49 comprises an electrically insulating material and does not provide an electrical contact to the columns 29 of the second conductivity type which are positioned within the inner edge termination region 31. The second contacts 49 may be referred to as dummy contacts. The columns 29 of the second conductivity type that are positioned in the inner edge termination region 31 are, therefore, electrically floating. In some embodiments, the openings 50 for forming the second contacts 49 may be filled with the insulating layer 44 which further extends onto and is positioned on the first surface 12 and which covers the gate electrodes 23. In some embodiments, the insulating layer 44 also covers the edge trenches 38 in the outer edge termination region 32. The conductive layer 52 which is coupled to source potential may extend over the insulating layer 44 towards the side face 14 and form a field plate.

The number of columns 29 of the second conductivity type positioned in the inner edge termination region 31 may vary from that illustrated in FIG. 1B, but at least one column 29 of the second conductivity type is positioned the inner edge termination region 31.

FIG. 1C illustrates a cross-sectional view of an edge termination region 16' according to another embodiment. The edge termination region 16' differs from the edge termination 16 illustrated in and described with reference to FIG. 1B, in that the body region 19 is positioned only in the active area 15 and does not extend throughout the inner edge termination region 31 and outer edge termination region 32. In the inner edge termination region and the outer edge termination region, the drift region 18 or semiconductor body 11 having the first conductivity type extends to the first surface 12.

Figure 1D:
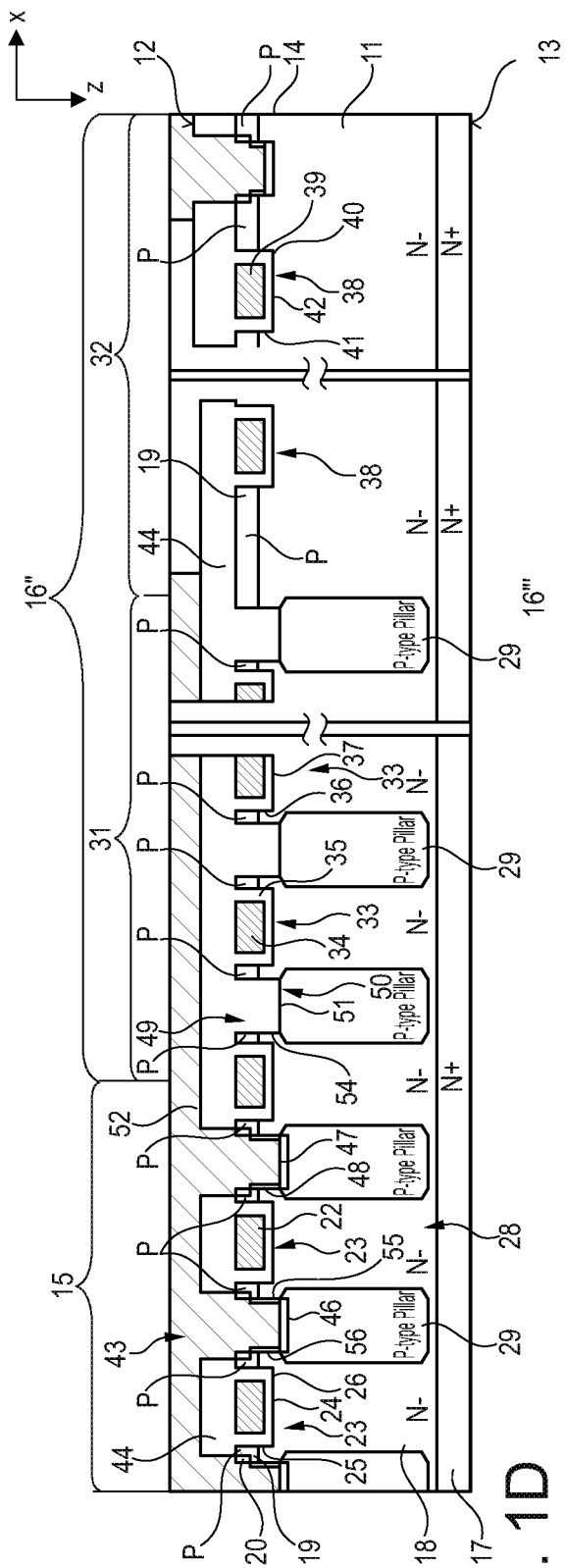
FIG. 1D illustrates a cross-sectional view of the edge termination region according to an embodiment.

FIG. 1D illustrates a cross-sectional view of an edge termination region 16" according to another embodiment. The edge termination region 16" differs from the edge termination region 16 illustrated in and described with reference to FIG. 1B in that the inner edge termination region 31 further comprises at least one trench 33, with one trench 33 being positioned between adjacent second contacts 49 and adjacent ones of the columns 29 of the second conductivity type. Each trench 33 is laterally spaced apart from the adjacent contacts 49 and columns 29 of the second conductivity type by the drift region 18 and body region 19. Each of the trenches 33 extends into the semiconductor body 11 from the first surface 12 and has a base 37 which is positioned in the drift region 18. Similar to the embodiment illustrated in and described with reference to FIG. 1B, the body region 19 extends throughout the edge termination region 16" to the side faces 14 of the semiconductor body 11. In some embodiments, the trench 33 has the same structure as the gate trenches 23 and includes an electrically conductive portion 34 which is electrically insulated from the semiconductor body 11 by a dielectric layer 35 lining the sidewalls 36 and base 37 of the trench 33. The conductive material 34 within the trench(es) 33 positioned in the inner edge termination region 31 is, however, not electrically coupled to the gate electrodes 22 positioned in the gate trenches 23 in the active area 15 and is electrically floating. The conductive material 34 is electrically insulated from the overlying conductive layer 52 providing a field plate by the intervening dielectric layer 44. This structure for the trenches 33 can be the same as the structure of the gate trenches 23 and also of the edge trenches 38 for manufacturing convenience as the edge trenches 38, trenches 33 and gate trenches 23 can be fabricated in the same process. Furthermore, stress distribution in the active area 15 and adjoining portion of the edge termination region 16" is more uniform.

Figure 1E:
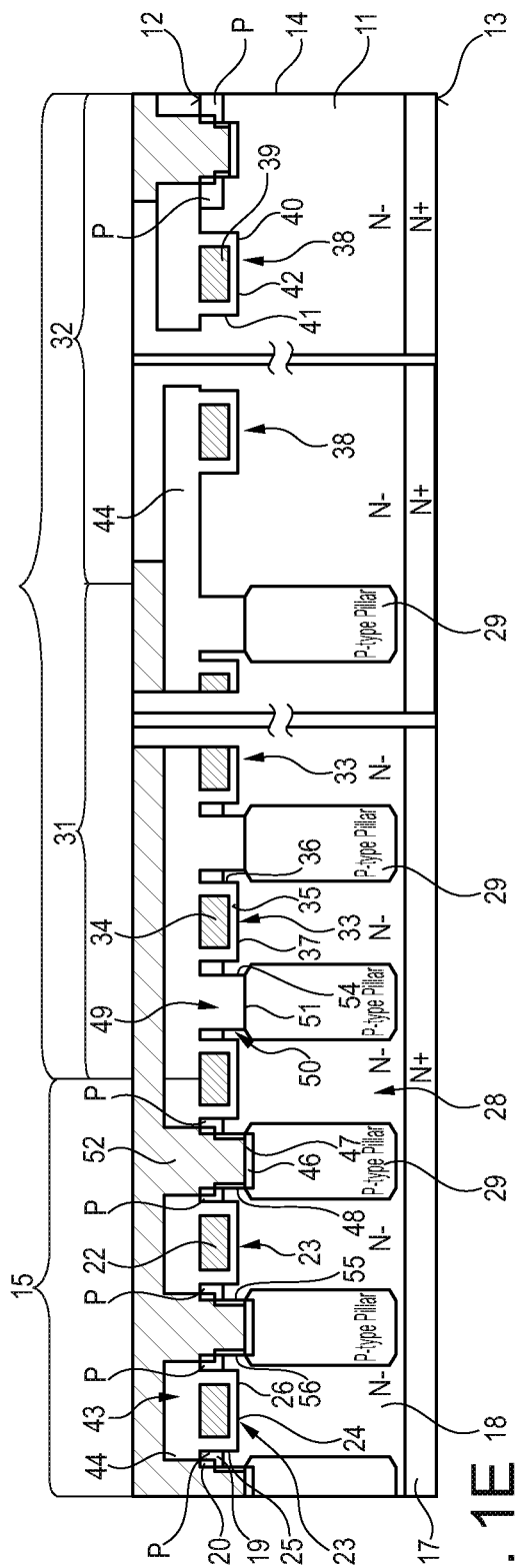
FIG. 1E illustrates a cross-sectional view of the edge termination region according to an embodiment.

FIG. 1E illustrates a cross-sectional view of an edge termination region 16''' according to another embodiment. The edge termination region 16''' is similar to that illustrated in and descried with reference to FIG. 1C, in that it does not include a body region in the edge termination region so that the drift region 18 extends to the first surface 12 in the inner and outer edge termination regions 31, 32. The edge termination region 16''' is similar to that illustrated in and described with reference to FIG. 1D in that it also includes at least one trench 33 in the inner edge termination region 31, with one trench 33 being positioned between neighbouring ones of the columns 29 of the second conductivity type. Each of the trenches 33 extends into the semiconductor body from the first surface 12 and has a base 37 which is positioned in the drift region 18. In some embodiments, the trenches 33 may have the same structure as the gate trenches 23 and include an electrically conductive portion 34 which is electrically insulated from the semiconductor body 11 by a dielectric layer 35 lining the sidewalls 36 and base 37 of the trench 33. The conductive material within the trenches 33 positioned in the inner edge termination region 31 is electrically floating and electrically insulated from the overlying conductive layer 52 by the intervening dielectric layer 44.

FIG. 2A illustrates a cross-sectional view of an edge termination region 116 according to an embodiment. In this embodiment, the edge termination region 116 of the super-junction transistor device 10 is similar to that illustrated in and described with reference to FIG. 1B but further includes a transition region 30 that is positioned laterally between the active region 15 and the inner edge termination region 31.

The transition region 30 laterally surrounds the active region 15 and the inner edge termination region 31 laterally surrounds the transition region 30. In this embodiment, the body region 19 extends throughout the edge termination region, i.e. further extends from the active region 15 through the transition region 30, the inner edge termination region 31 and the outer edge termination region 32 to the side faces 14 of the semiconductor body 11.

One or more columns 29 comprising the second conductivity type are positioned in the transition region 30 in addition to in the edge termination region 31 and the active area 15. The transition region 30 is distinguishable from the inner edge termination region 31 in that the columns 29 of the second conductivity type in the transition region 30 are electrically connected by an electrically conductive first contact 43 to source potential and to the conductive layer 52, whereas in the inner edge termination region 31 the columns 29 of the second conductivity type are electrically floating, since the second contacts 49 comprise insulating material. The source region is, however, not positioned in the transition region 30 which distinguishes the transition region 30 from the active region 15. in this embodiment, one trench 33, similar to that illustrated in and described with reference to FIG. 1C, is positioned between neighbouring ones of the columns 29 of the second conductivity type in the transition region 30. However, different from the arrangement illustrated in and described with reference to FIG. 1C, there are no trenches arranged between neighbouring ones of the columns 29 of the second conductivity type in the inner edge termination region 31

In the edge termination region 116, the trench 50 for each of the second contacts 49 to the columns 29 of the conductivity type that are positioned in the inner edge termination region 31 is filled with insulating material of the insulating layer 44 that is positioned on the first surface 12 of the semiconductor body 11.

In other non-illustrated embodiments, the second contact 49 comprises an insulating material which lines the sidewalls 54 and base 51 of the trench 50 and further comprises conductive material positioned in the opening in the gap between the layer of insulating material lining the sidewalls 54 and base 51 of the second trench 50. The conductive material may be formed at the same time as the conductive material is inserted into the trenches for the first contacts 43 and may, therefore, be electrically connected to the source contact of the transistor device 10. Due to the insulating material 53 which lines the trench 50 for the second contact 49, this conductive material and the second contact is electrically insulated from the column 29 of the second conductivity type in the inner edge termination region 31. The columns 29 of the second conductivity type that are positioned in the inner edge termination region 31 are, therefore electrically floating.

In other non-illustrated embodiments, the body region 19 is omitted from the edge termination region 116 and positioned exclusively in the active area 15.

Figure 2B:
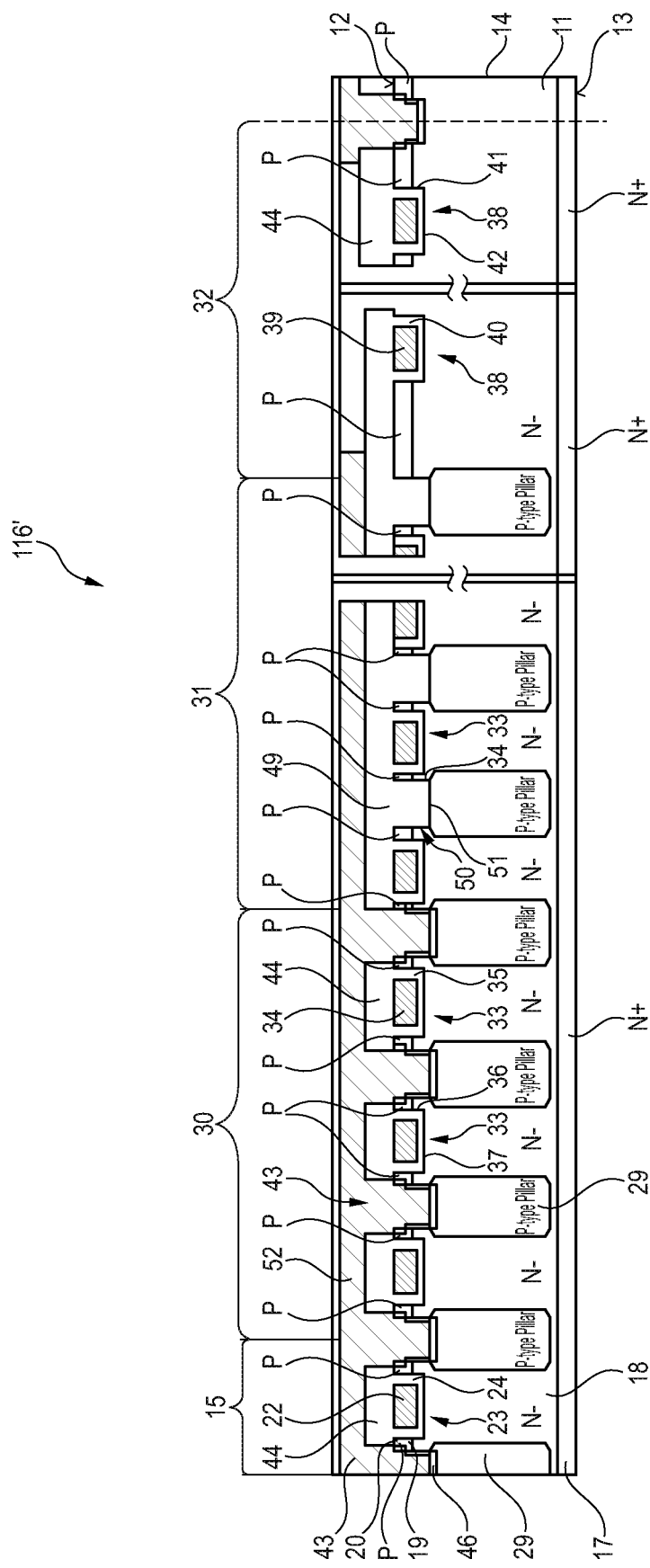
FIG. 2B illustrates a cross-sectional view of an edge termination region of a transistor device according to an embodiment.

FIG. 2B illustrates a cross-sectional view of an edge termination 116' according to an embodiment. In this embodiment, similar to that described with reference to FIG. 2A, the edge termination region 116' of the transistor device 10 includes a transition region 30 that is positioned laterally between the active region 15 and the inner edge termination region 31. The transition region 30 includes one or more columns 29 comprising the second conductivity and differs from the inner edge termination region 31 in that the columns 29 of the second conductivity type are electrically connected by an electrically conductive first contact 43 to source potential and to the conductive layer 52. The source region is, however, not positioned in the transition region 30 which distinguishes the transition region 30 from the active region 15. In this embodiment, the body region 19 extends throughout the edge termination region, i.e. further extends from the active region 15 through the transition region 30, the inner edge termination region 31 and the outer edge termination region 32 to the side faces 14 of the semiconductor body 11. The edge termination region 116' illustrated in FIG. 2B differs from that illustrated in FIG. 2A in that one trench 33 is positioned between neighbouring ones of the columns 29 of the second conductivity type in both the transition region 30 and in the inner edge termination region 31.

In other non-illustrated embodiments, the body region 19 is omitted from the edge termination region 116 and positioned exclusively in the active area 15.

Figure 3A:
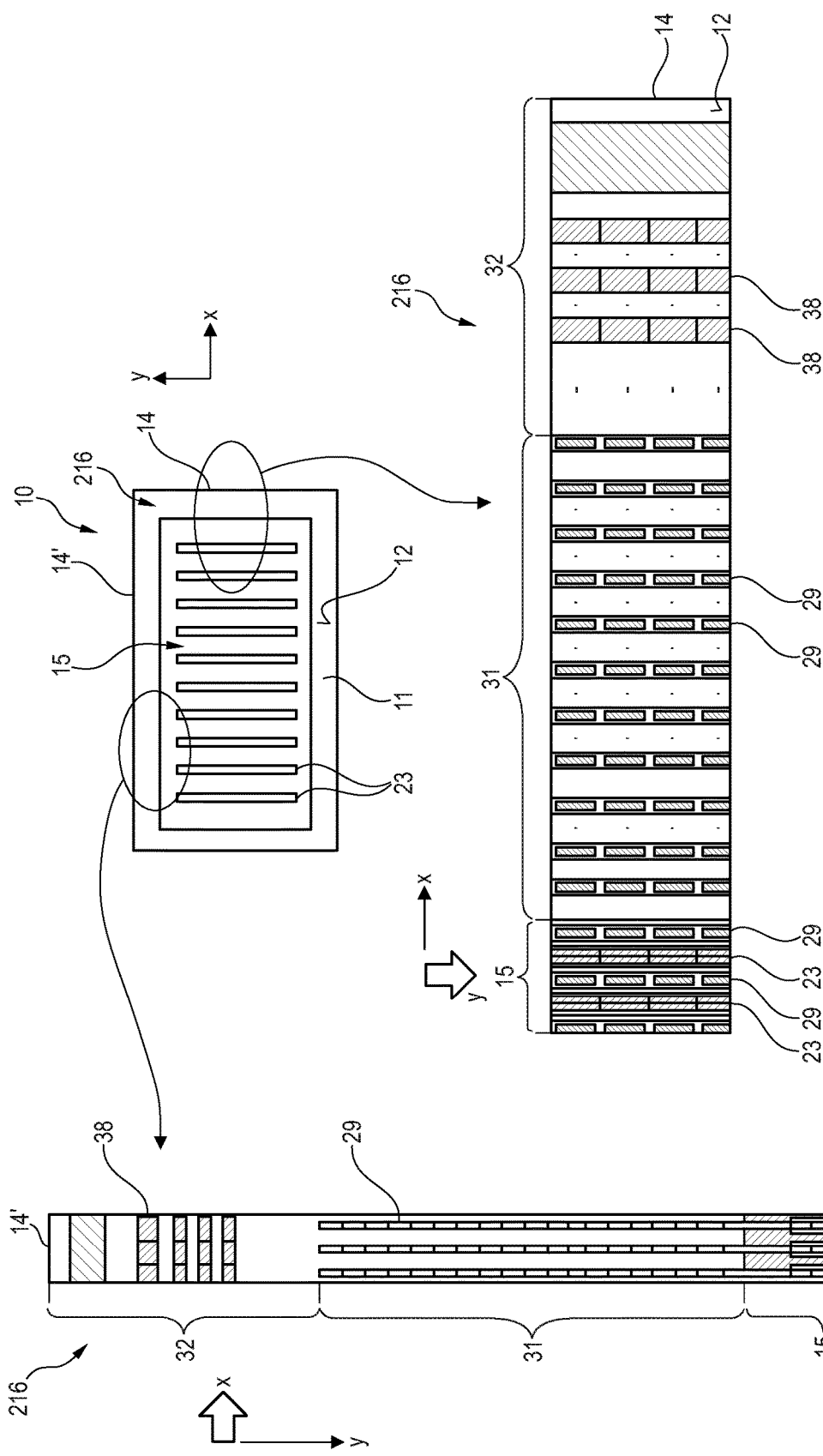
FIG. 3A illustrates a plan view of a first portion of an edge termination region of a transistor device according to an embodiment.
Figure 3B:
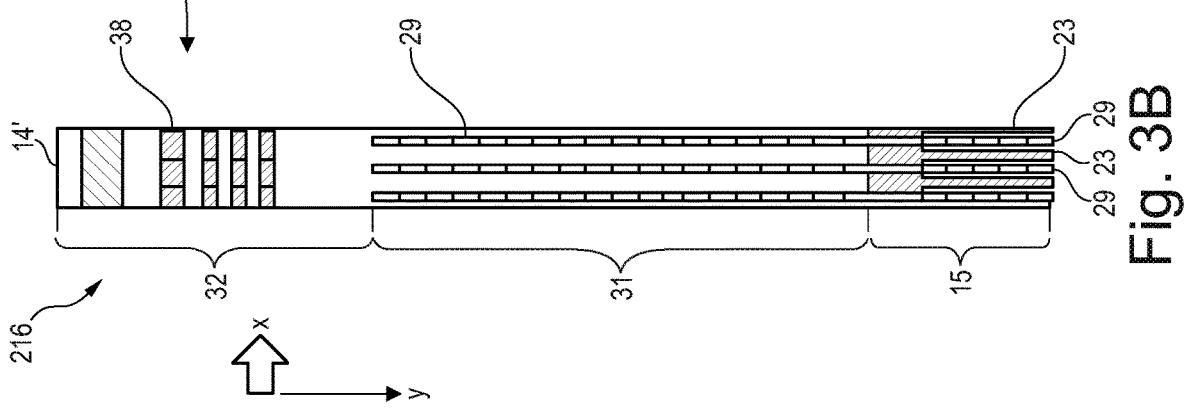
FIG. 3B illustrates a plan view of a second portion of an edge termination region. of a transistor device according to an embodiment.

FIG. 3A illustrates a plan view of a first portion of an edge termination region 216 of a superjunction transistor device 10 and FIG. 3B illustrates a plan view of a second portion of the edge termination region 216 according to an embodiment. FIG. 3A illustrates a view of a section the edge termination region 216 in a direction which extends parallel to the length of the gate trenches 23, which is indicated as the y direction using the orientation of the Cartesian coordinate system illustrated in FIG. 3A. This section may also be referred to as a longitudinal portion of the edge termination region 216. FIG. 3B illustrates a view of a section of the edge termination region 216 at a position of the semiconductor body 11 which is substantially perpendicular to the portion of the edge termination region 116 illustrated in FIG. 3A, which is indicated as the x direction using the orientation of the Cartesian coordinate system illustrated in FIG. 3B. This section may be referred to as a transverse portion of the edge termination region 216.

In the active area 15, a gate trench 23 is positioned between neighbouring ones of the columns 29 of the second conductivity type. The gate trenches 23 and columns 29 of the second conductivity type extend substantially parallel to one another in the y direction. The edge termination region 216 comprises an inner edge termination 31 and outer edge termination 32. Referring to FIG. 3A, in the longitudinal portion, the inner edge termination 31 comprises columns 29 of the second conductivity type which extend substantially parallel to the columns 29 of the second conductivity type and the length of the gate trenches 23 in the active area 15. The inner edge termination region 31 does not include any trenches in this embodiment. The outer edge termination region 32 is free of columns 29 of the second conductivity type but includes three edge trenches 38 which extend substantially parallel to the columns 29 of the second conductivity type and the length of the gate trenches 23 in the active area 15.

In some embodiments, such as that illustrated in FIGS. 3A and 3B, the trenches for the columns 29 of the second conductivity and consequently the columns 29 of the second conductivity have an elongate stripe shape in plan view. However, in other embodiments, the trenches for the columns of the second conductivity type and the columns of the second conductivity have a columnar or needle shape which are arranged in rows or in a regular array.

Referring to FIG. 3B, in the transverse portion, the edge termination region 216 also comprises an inner edge termination region 31 comprising columns 29 of the second conductivity type and an outer edge termination region 32 comprising one or more edge trenches 38. However, in this transverse portion of the edge termination region 116, the edge trenches 38 extend substantially perpendicularly to the columns 29 of the second conductivity type. The edge trenches 38 may laterally surround the active area 15 and extend in the x direction in this transverse portion, whereas the edge trenches 38 extend in the y direction in the longitudinal portion of the edge termination region 116 illustrated in FIG. 3A. In the transverse portion of the edge termination region 216 illustrated in FIG. 3B, the columns 29 of the second conductivity type extend parallel to the columns 29 of the second conductivity type and to the length of the gate trenches 23 in the active area 15 and perpendicular to the edge trenches 38. The columns 29 of the second conductivity type may extend from the active region 15 into the inner edge termination region 31 so that one column 29 of the conductivity type is common to both the active area 15 and the inner edge termination region 29.

The arrangement illustrated in FIGS. 3A and 3B of the columns 29 of the second conductivity type may also be used in embodiments in which the edge termination region further includes a transition region with columns 29 of the second conductivity type between the active area 15 and the inner edge termination region 31. A trench may be provided between neighbouring ones of the columns 29 of the second conductivity type in the inner edge termination region 31 and transition region 30 if present.

FIG. 4A illustrates a plan view of a portion of an edge termination region 316 of a superjunction transistor device according to an embodiment. The active area comprises columns 29 of the second conductivity type with a gate trench 23 being positioned between neighbouring ones of the columns 29 of the second conductivity type. The gate trenches 23 and columns 29 of the second conductivity type extend substantially parallel to one another in the y direction indicated in FIG. 4A. In this embodiment, the edge termination region 316 comprises an inner edge termination region 31 which comprises a plurality of columns 29 of the second conductivity type which extend substantially perpendicularly to the columns 29 of the second conductivity type arranged in the active area 15 and, therefore, extend in the x direction using the Cartesian coordinate system indicated in FIG. 4A. The inner edge termination region 31 further includes trenches 33, one trench 33 being arranged between and extending parallel to the columns 29 of the second conductivity type. The trenches 33 in the inner edge termination region 31, therefore, also extend substantially perpendicularly to the gate trenches 23 and columns 29 of the second conductivity type in the active area 15. The outer edge termination region 32 of the edge termination region 316 is free of columns of the second conductivity type and comprises a plurality of edge trenches 38 which extend substantially parallel to the trenches 33 and columns 29 of the second conductivity type in the inner edge termination region 31 and, therefore in the x direction. The edge trenches 38 extend substantially perpendicularly to the gate trenches 23 and columns 29 of the second conductivity type in the active area 15.

FIG. 4B illustrates a plan view of a portion of an edge termination region 316' according to an embodiment, which is similar to that illustrated in FIG. 4A but differs in that the inner edge termination region 31 is free of trenches positioned between the columns 29 of the second conductivity type.

In the edge termination region 316, 316' illustrated in FIGS. 4A and 4B, five columns 29 of the second conductivity type in the inner edge termination region 31 and six edge trenches 38 in the outer edge termination region 32 are provided. Additionally, in the edge termination region 316' illustrated in FIG. 4B, four trenches 33 are provided in the inner edge termination region 31. However, the numbers of edge trenches 38 and columns 29 of the second conductivity type in the edge termination region may differ. FIG. 4C illustrates a plan view of a portion of an edge termination region 316" according to an embodiment, which is similar to that illustrated in FIG. 4B but differs in that only three columns 29 of the second conductivity type are provided in the inner edge termination region 31.

Referring to FIGS. 1A to 1E, the first surface of the semiconductor body 11 of the transistor device 10 is typically square or rectangular in plan view so that corners are formed between adjoining ones of the side faces 14. The edge termination region 16 laterally surrounds the active area 15. Consequently, the edge termination region 16 may have different designs in the corner regions of the first surface 12.

Figure 5A:
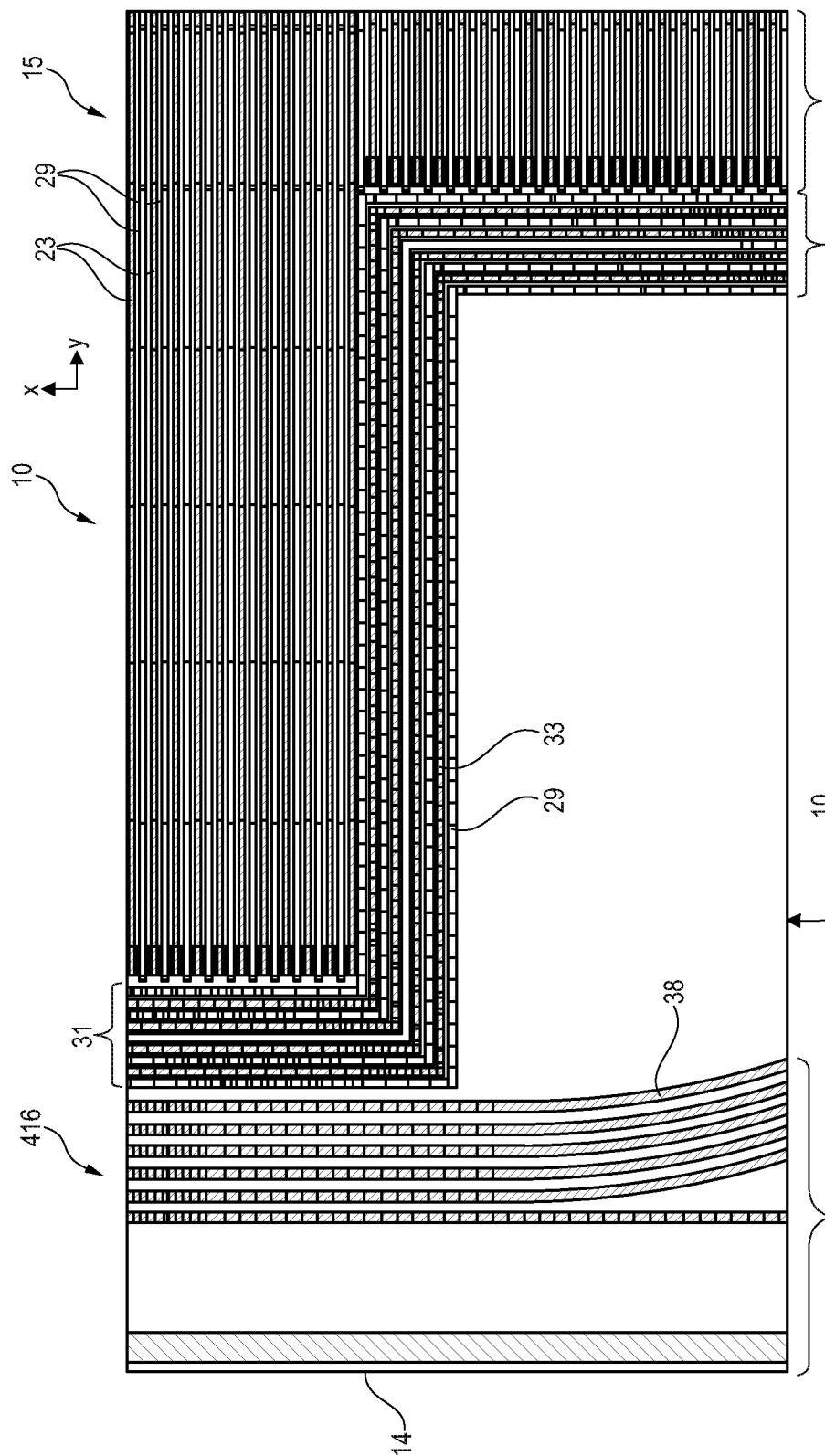
FIG. 5A illustrates a plan view of a corner portion of an edge termination region of a transistor device according to an embodiment.

FIG. 5A illustrates a plan view of a corner portion of an edge termination region 416 of a superjunction transistor device 10 according to an embodiment. The active area 15 comprises a plurality of columns 29 of the first conductivity type arranged alternately with gate trenches 23 which in the orientation depicted in FIG. 5A extend have a long direction extending in the Y direction. The edge termination region 416 comprises an inner edge termination region 31 comprising columns 29 of the second conductivity type alternately arranged with trenches 33 and an outer edge termination region comprising a plurality of edge trenches 38 and no columns 29 of the second conductivity type.

In the edge termination region 416, the columns 29 of the second conductivity type and trenches 33 in the inner edge termination region 31 laterally surround the active area 15. In the corner region of the first surface 12 depicted in FIG. 5A, the active area 15 does not extend into the corner region formed between the adjoining side faces 14, 14' so that the distal ends of the laterally outermost ones of the gate trenches 23 and columns 29 of the second concavity type are spaced apart from the side face 14 by a greater distance than those gate trenches 23 and columns 29 of the second concavity type positioned intermediate the length of the side face 14. A gate pad may be arranged in this corner region.

To laterally surround the active area 15, the columns 29 of the second conductivity type and the trenches 33 of the inner edge termination region 31 extend in a first portion in the x direction, substantially parallel to the side face 14 and perpendicularly to the long direction of the gate trenches 23, then change direction by extending around a corner of substantially 90° to extend substantially parallel to the gate trenches 23 in a second portion and then extend around another corner of substantially 90° to extend substantially perpendicularly to the gate trenches 23 in a third portion. The trenches 33 and columns 29 of the second conductivity type in the inner edge termination region 31 can be considered to have a stepped layout in plan view in the corner region. In contrast, the edge trenches 38 in the outer edge termination region 32 to not have a sharp change of direction but have a curved form in plan view and are therefore spaced further apart from the outermost one of the columns 29 of the second conductivity type in the inner edge termination region 31 at the corner than in positions of the inner edge termination region 31 positioned intermediate the length of the side faces 14 of the semiconductor body 11.

FIG. 5B illustrates an embodiment of the edge termination region 416' which is similar to that illustrated in FIG. 5A but differs in that there are no trenches in the inner edge termination region 31 between the columns 29 of the second conductivity type. The columns 29 of the second conductivity have the stepped form shown in FIG. 5A.

Figure 5D:
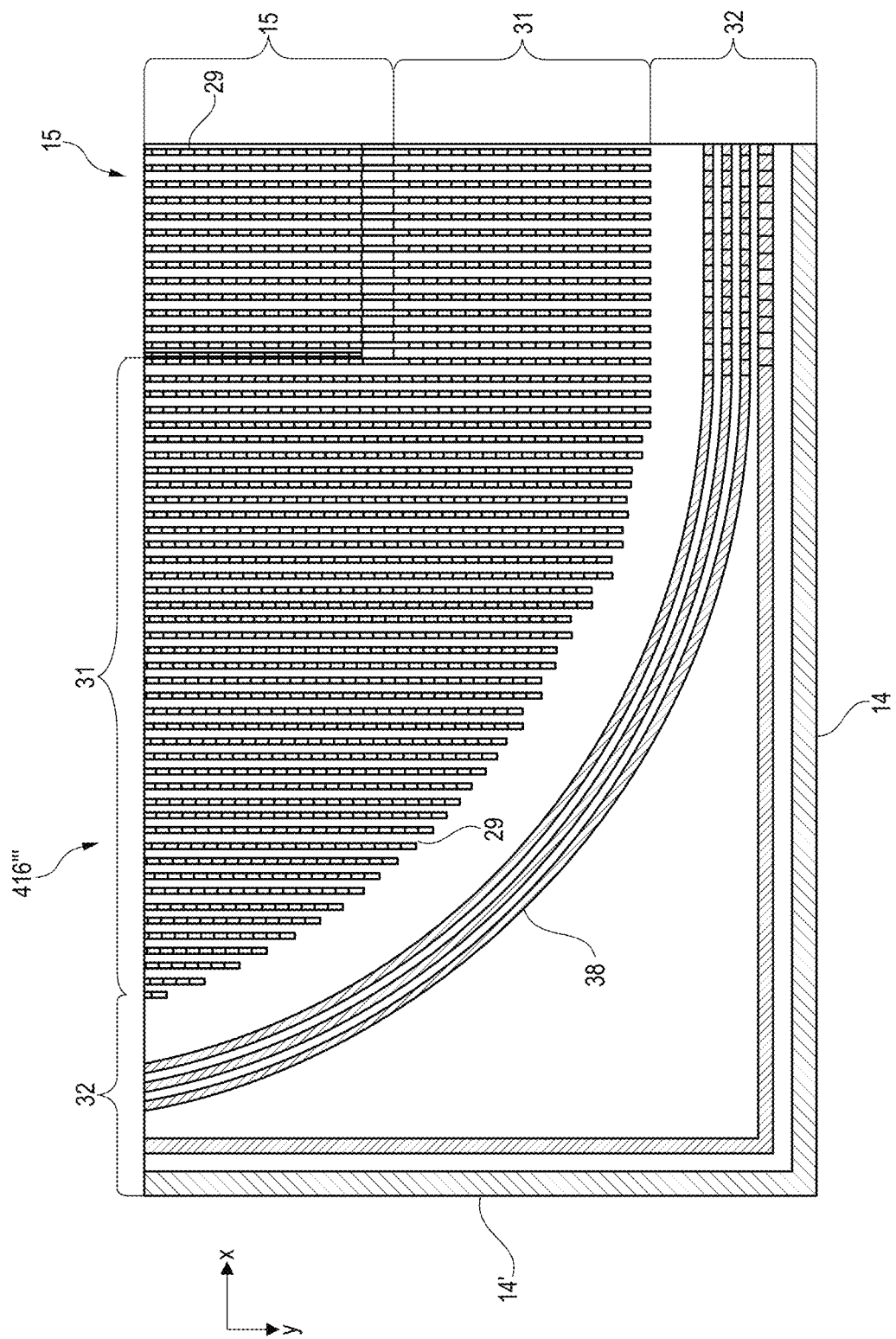
FIG. 5D illustrates a plan view of a corner portion of an edge termination region of a transistor device according to an embodiment.

FIG. 5C illustrates a plan view of a corner portion of an edge termination region 416" according to an embodiment in which the columns 29 and trenches 33 of the edge termination region laterally surround the active area 15. In this embodiment, however, the columns 29 of the second conductivity type and the trenches 33 in the inner edge termination region have a curved form in the corner regions of the first surface 12. In this embodiment, the length of the gate trenches 23 and columns 29 of the second conductivity type in the active area gradually decreases in the corner region towards the side face 14', such that the spacing between the innermost one of the columns 29 of the second conductivity type in the inner edge termination region 31 and the outermost distal ends of the columns 29 of the second conductivity type in the active area 15 is as uniform as possible FIG. 5D illustrates an edge termination structure 416''' which is similar to that illustrated in FIG. 5C but differs in the number of columns 29 of the second conductivity type and also differs in that there are no trenches positioned in the inner edge termination region 31. The columns 29 of the second conductivity type in the inner edge termination region 31 have a curved form in the corner regions so as to laterally surround the active area 15.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:
a semiconductor body comprising a first surface, a second surface opposing the first surface, and side faces;
an active area;
an edge termination region laterally surrounding the active area;
a drain region of a first conductivity type at the second surface;
a drift region of the first conductivity type on the drain region;
in the active area, a body region of a second conductivity type that opposes the first conductivity type arranged on the drift region, a source region of the first conductivity type arranged on the body region, and at least one gate electrode positioned in a gate trench that extends into the semiconductor body from the first surface, wherein the gate electrode is electrically insulated from the semiconductor body by a gate dielectric;
a superjunction structure comprising a plurality of columns of the second conductivity type extending into the semiconductor body substantially perpendicular to the first surface, the superjunction structure being positioned in the active area and in the edge termination region; and
a plurality of first contacts, wherein a first contact of the plurality of first contacts extends through the body region for each of the columns of the second conductivity type in the active region, wherein the first contact comprises electrically conductive material.

2. The transistor device of claim 1, wherein the body region further extends from the active region over the edge termination region to the side faces of the semiconductor body.

3. The transistor device of claim 1, wherein in the edge termination region, the drift region extends to the first surface of the semiconductor body.

4. The transistor device of claim 1, wherein the edge termination region comprises an inner edge termination region and an outer edge termination region, wherein one or more columns of the second conductivity type are arranged in the inner edge termination region, and wherein the outer edge termination region is free of columns of the second conductivity type.

5. The transistor device of claim 4, wherein in the active region, the columns of the second conductivity type are electrically connected to source potential, and wherein in the inner termination region, one or more of the columns of the second conductivity type are electrically floating.

6. The transistor device of claim 4, further comprising a second contact for each of the columns of the second conductivity type in the inner termination region, wherein the second contact comprises an insulating material.

7. The transistor device of claim 6, wherein the second contact further comprises conductive material that is electrically insulated from the semiconductor body by the insulating material.

8. The transistor device of claim 4, further comprising a transition region arranged laterally between the active area and the inner edge termination region, wherein one or more columns of the second conductivity type are arranged in the transition region and are electrically connected to source potential.

9. The transistor device of claim 8, wherein a contact extends to each of the columns of the second conductivity type in the transition region.

10. The transistor device of claim 9, further comprising one or more trenches in the transition region, wherein one trench of the one or more trenches is arranged laterally between individual ones of the columns of the second conductivity type.

11. The transistor device of claim 10, wherein each of the one or more trenches laterally surrounds the active area.

12. The transistor device of claim 10, wherein each of the one or more trenches comprises conductive material that is electrically insulated from the semiconductor body by insulating material that lines the trench.

13. The transistor device of claim 4, further comprising one or more trenches in the inner edge termination region, wherein one trench of the one or more trenches is arranged laterally between individual ones of the columns of the second conductivity type.

14. The transistor device of claim 13, wherein each of the one or more trenches laterally surrounds the active area.

15. The transistor device of claim 13, wherein each of the one or more trenches comprises conductive material that is electrically insulated from the semiconductor body by insulating material that lines the trench.

16. The transistor device of claim 4, further comprising at least one edge trench arranged in the outer edge termination region, wherein the at least one edge trench laterally and continuously surrounds the active area.

17. The transistor device of claim 1, further comprising a contact well arranged at a base of each of the first contacts in the active area, wherein the contact well is of the second conductivity type, contacts the column of the second conductivity type, and is spaced apart from the body region.

* * * * *